US010008396B2

(12) United States Patent
Sirard et al.

(10) Patent No.: US 10,008,396 B2
(45) Date of Patent: Jun. 26, 2018

(54) METHOD FOR COLLAPSE-FREE DRYING OF HIGH ASPECT RATIO STRUCTURES

(71) Applicant: LAM RESEARCH CORPORATION, Fremont, CA (US)

(72) Inventors: Stephen Sirard, Austin, TX (US); Ratchana Limary, Austin, TX (US)

(73) Assignee: LAM RESEARCH CORPORATION, Fremont, CA (US)

( * ) Notice: Subject to any disclaimer, the term of this patent is extended or adjusted under 35 U.S.C. 154(b) by 312 days.

(21) Appl. No.: 14/730,457

(22) Filed: Jun. 4, 2015

(65) Prior Publication Data

US 2016/0099160 A1 Apr. 7, 2016

Related U.S. Application Data

(63) Continuation-in-part of application No. 14/507,080, filed on Oct. 6, 2014.

(51) Int. Cl.

*F26B 3/34* (2006.01)
*H01L 21/67* (2006.01)
*H01L 21/02* (2006.01)

(52) U.S. Cl.

CPC .. *H01L 21/67034* (2013.01); *H01L 21/02057* (2013.01); *H01L 21/67028* (2013.01)

(58) Field of Classification Search

CPC .................... H01L 21/67034; H01L 21/67028
USPC ....... 34/255, 259, 265; 438/9, 474, 475, 513
See application file for complete search history.

(56) References Cited

U.S. PATENT DOCUMENTS 4,892,635 A 1/1990 Kornblit
5,209,877 A * 5/1993 Frances .................. C09D 7/002 264/140
5,486,235 A * 1/1996 Ye ......................... B08B 7/0035 134/1.1
5,571,447 A 11/1996 Ward et al.
6,072,006 A 6/2000 Bantu et al.
6,337,277 B1 1/2002 Chou et al.
(Continued)

OTHER PUBLICATIONS

Amitabh Bansal, et al., Controlling the thermomechanical properties of polymer nanocomposites by tailoring the polymer-particle interface, Sep. 5, 2006, Journal of Polymer Science, vol. 22, pp. 2944-2950.*
(Continued)

*Primary Examiner* — John McCormack

(57) ABSTRACT

A method for drying a substrate including a plurality of high aspect ratio (HAR) structures includes, after at least one of (i) wet etching, and (ii) wet cleaning, and (iii) wet rinsing the substrate using at least one of (a) wet etching solution, and (b) wet cleaning solution, and (c) wet rinsing solution, respectively, and without drying the substrate: depositing, between the plurality of HAR structures, a solution that includes a polymer component, a nanoparticle component, and a solvent; wherein as the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution; and exposing the substrate to plasma generated using a plasma gas chemistry to volatilize the sacrificial bracing material.

40 Claims, 12 Drawing Sheets

(56) References Cited

U.S. PATENT DOCUMENTS

| | | | |
|---|---|---|---|
| 7,687,406 B2 | 3/2010 | Daley et al. | |
| 8,058,178 B1 | 11/2011 | Goto et al. | |
| 8,187,951 B1 | 5/2012 | Wang | |
| 8,898,928 B2 | 12/2014 | Sirard et al. | |
| 2002/0132184 A1 | 9/2002 | Babcock | |
| 2002/0168785 A1 | 11/2002 | Paz de Araujo et al. | |
| 2003/0017420 A1 | 1/2003 | Mahorowala | |
| 2003/0045098 A1 | 3/2003 | Verhaverbeke et al. | |
| 2005/0106493 A1 | 5/2005 | Ho et al. | |
| 2009/0083977 A1* | 4/2009 | Hanke | H01L 21/76898 29/852 |
| 2010/0055807 A1 | 3/2010 | Srivastava et al. | |
| 2010/0183851 A1* | 7/2010 | Cao | C08F 220/34 428/195.1 |
| 2011/0189858 A1 | 8/2011 | Yasseri et al. | |
| 2012/0094493 A1 | 4/2012 | Hizawa et al. | |
| 2012/0276333 A1* | 11/2012 | Hong | B29C 59/022 428/141 |
| 2013/0008868 A1* | 1/2013 | Uozumi | G03F 7/162 216/41 |
| 2013/0143406 A1 | 6/2013 | Hsu et al. | |
| 2013/0189831 A1* | 7/2013 | Li | H01L 21/02381 438/479 |
| 2014/0252342 A1* | 9/2014 | Ramadas | H01L 21/56 257/40 |
| 2014/0273476 A1* | 9/2014 | Cheng | B81C 1/00031 438/703 |
| 2014/0373384 A1* | 12/2014 | Sirard | H01L 21/02057 34/357 |
| 2015/0282310 A1* | 10/2015 | Kawakita | H01B 1/22 428/139 |
| 2016/0042945 A1 | 2/2016 | Limary et al. | |
| 2016/0064696 A1* | 3/2016 | Collier | H01L 21/477 428/161 |

OTHER PUBLICATIONS

DiLauro, Anthony M., and Phillips, Scott T.; "Continuous Head-to-Tail Depolymerization: An Emerging Concept for Imparting Amplified Responses to Stimuli-Responsive Materials;" MacroLetter; American Chemical Society Publications; pp. 298-304; Published Mar. 12, 2014.

DiLauro, Anthony M., Zhang, Hua, Baker, Matthew S., Sen, Flory Wong Ayusman, and Phillips, Scott T.; Accessibility of Responsive End-Caps in Films Composed of Stimuli-Responsive, Depolymerizable Poly(phthalaldehydes); Macromolecules; American Chemical Society Publications; pp. 7257-7265; Published Sep. 12, 2013.

Kokubo, Ken, Shirakawa, Shogo, Kobayashi, Naoki, Aoshima, Hisae and Oshima, Takumi; "Facile and Scalable Synthesis of a Highly Hydoxylated Water-Soluble Fullerenol as a Single Nanoparticle;" Nano Research; pp. 204-215; Nov. 1, 2010.

Robbins, Jessica S., Schmid, Kyle M. And Phillips. Scott T.; "Effects of Electronics, Aromaticity, and Solvent Polarity on the Rate of Azaquinone-Methide-Mediated Depolymerization of Aromatic Carbamate Oligomers;" The Journal of Organic Chemistry; pp. 3159-3169; Published Feb. 18, 2013.

Seo, Wanji and Phillips, Scott T.; "Patterned Plastics that Change Physical Structure in Response to Applied Chemical Signals;" JACS Communications; pp. 9234-9235; Published Online Jun. 21, 2010.

Viger, Mathieu L., Grossman, Madeline, Fomina, Nadezda, and Almutairi, Adah; "Low Power Upconverted Near-IR Light for Efficient Polymeric Nanoparticle Degradation and Cargo Release;" Advanced Materials; pp. 3733-3738; 2013.

U.S. Appl. No. 13/924,314, filed Dec. 25, 2014, Sirard et al.

U.S. Appl. No. 14/489,615, Limary et al.

U.S. Appl. No. 14/507,080, Sirard et al.

Kropka, Jamie M., Sakai, Victoria Sakai and Green, Peter F. "Local Polymer Dynamics in Polymer- $C_{60}$ Mixtures"; Nano Letters; 2008; vol. 8, No. 4, pp. 1061-1065; Revised Jan. 21, 2008.

* cited by examiner

METHOD FOR COLLAPSE-FREE DRYING OF HIGH ASPECT RATIO STRUCTURES

CROSS-REFERENCE TO RELATED APPLICATIONS

The present disclosure is a continuation-in-part of U.S. patent application Ser. No. 14/507,080, filed on Oct. 6, 2014. The entire disclosure of the application referenced above is incorporated herein by reference.

FIELD

The present disclosure relates to systems and methods for processing substrates, and more particularly to systems and methods for drying high aspect ratio (HAR) structures of a substrate without collapse.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Fabrication of substrates such as semiconductor wafers typically requires multiple processing steps that may include material deposition, planarization, feature patterning, feature etching, and/or feature cleaning. These processing steps are typically repeated one or more times during processing of the substrate.

As semiconductor devices continue to scale down to smaller feature sizes, high aspect ratio (HAR) structures are increasingly required to achieve desired device performance objectives. The use of the HAR structures creates challenges for some of the substrate processing steps.

For example, wet processes such as etching and cleaning pose problems for the HAR structures due to capillary forces that are generated during drying of the substrate. The strength of the capillary forces depends upon surface tension, a contact angle of the etching, cleaning, or rinsing fluids that are being dried, feature spacing and/or an aspect ratio of the structures. If the capillary forces generated during drying are too high, the HAR structures will become strained or collapse onto each other and stiction may occur, which severely degrades device yield.

One approach to preventing collapse and stiction uses rinsing liquids that have a lower surface tension than deionized water to prevent the structures from collapsing. While generally successful for relatively low aspect ratio structures, this approach may have the same collapse and stiction issues on higher aspect ratio structures as methods that use deionized water. The rinsing fluids still possess a finite amount of surface tension that generates forces during drying that are still too strong for the fragile HAR structures.

An alternative approach for drying HAR structures involves dissolving and flushing the rinsing fluid with a supercritical fluid. Supercritical fluids are free of surface tension when processed correctly. However, several technical and manufacturing challenges arise when using the supercritical fluids. The challenges include high equipment and safety costs, long process times, variable solvent quality during the process, extreme sensitivity due to the diffuse and tunable nature of the fluid, and wafer defectivity and contamination issues arising from the interaction of the supercritical fluid with components of the processing chamber.

Another strategy for preventing collapse of HAR structures is to add a permanent mechanical bracing structure that supports the structures. There are several tradeoffs with this approach, such as higher cost and process complexity, which may negatively impact throughput and yield. Furthermore, the use of permanent mechanical bracing structures may be limited to certain types of HAR structures.

Freeze drying has also been proposed as an approach for drying HAR structures. Freeze drying eliminates collapse by initially freezing the solvent and then directly sublimating under vacuum. Freeze drying avoids the liquid/vapor interface, which minimizes capillary forces. While showing promise, freeze drying has relatively high cost, low throughput and high defects as compared to competing approaches.

Surface modification of sidewalls of the HAR structures may be performed. In this approach, small molecules may be chemically bonded to the sidewalls of the HAR structures. The small molecules improve collapse performance by either preventing the stiction of materials when they make contact or by altering a contact angle of the wet chemistry to minimize Laplace pressure. Surface modification does not fully eliminate the drying forces and the structures may deform during the drying process, which may cause damage. Furthermore, when surface materials are changed, new tailored molecules are required to bond to the sidewalls of the HAR structures.

SUMMARY

In a feature, a method for drying a substrate including a plurality of high aspect ratio (HAR) structures is described. The method includes, after at least one of (i) wet etching, and (ii) wet cleaning, and (iii) wet rinsing the substrate using at least one of (a) wet etching solution, and (b) wet cleaning solution, and (c) wet rinsing solution, respectively, and without drying the substrate: depositing, between the plurality of HAR structures, a solution that includes a polymer component, a nanoparticle component, and a solvent; wherein as the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution; and exposing the substrate to plasma generated using a plasma gas chemistry to volatilize the sacrificial bracing material.

In a feature, a system for drying a substrate including a plurality of high aspect ratio (HAR) structures is described. The system includes: a processing chamber; a substrate support arranged in the processing chamber; a gas delivery system to deliver a gas mixture to the processing chamber; a fluid delivery system configured to deliver a solution to the substrate; a plasma generator configured to generate plasma in the processing chamber; and a controller in communication with the fluid delivery system, the gas delivery system and the plasma generator. The controller is configured to, after one of (i) wet etching, or (ii) wet cleaning, or (iii) wet rinsing the substrate using at least one of (a) wet etching solution or (b) wet cleaning solution, or (c) wet rinsing solution, respectively, and without drying the substrate: deposit, between the plurality of HAR structures, a solution that includes a polymer component, a nanoparticle component, and a solvent; and expose the substrate to plasma generated using a plasma gas chemistry to volatilize the sacrificial bracing material. As the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Some sacrificial bracing methods have been used to prevent collapse of high aspect ratio (HAR) structures. For example only, commonly-assigned U.S. patent application Ser. No. 13/924,314, filed on Jun. 21, 2013, and entitled "Method of Collapse-Free Drying of High Aspect Ratio Structures", which is hereby incorporated by reference in its entirety, discloses a sacrificial bracing method. As described therein, a sacrificial bracing material, such as a glassy polymer or fullerene solution, is deposited into the HAR structures directly after the wet etching or cleaning process, but prior to drying the wafers.

As the solvent evaporates, the sacrificial bracing material precipitates out of solution and fills the structures. A mechanical brace is formed in the HAR structures to counter the capillary forces that are generated during solvent evaporation. Afterwards, the sacrificial bracing material is removed with a dry plasma process. The plasma process may use reactants, such as $N_2$, $O_2$, $H_2$, and/or $O_3$ gasses. As used herein, HAR refers to the HAR structures having an AR≥8:1, 10:1, 15:1, 20:1 or 50:1. The distance between adjacent structures in a HAR application is less than 40 nanometers (nm), less than 30 nm, or less than 20 nm.

Some sacrificial bracing materials, such as some polymeric sacrificial bracing materials, may undergo a glass transition during sacrificial bracing material removal and form a melt. The melt may behave like a liquid and can induce HAR structure collapse during removal of the sacrificial bracing material.

According to the present disclosure, the sacrificial bracing material includes a nanoparticle material (e.g., a fullerol) and a polymer. The nanoparticle material increases the glass transition temperature of the sacrificial bracing material to greater than the glass transition temperature of the polymer. The higher glass transition temperature may enable higher ash temperatures leading to a faster plasma removal rate of the sacrificial bracing material, which decreases processing time and increases throughput. The relative amounts of nanoparticle material and polymer that are used may also be selected to decrease surface tension and/or increase fluidity to increase filling of spaces between HAR structures.

Figure 1:
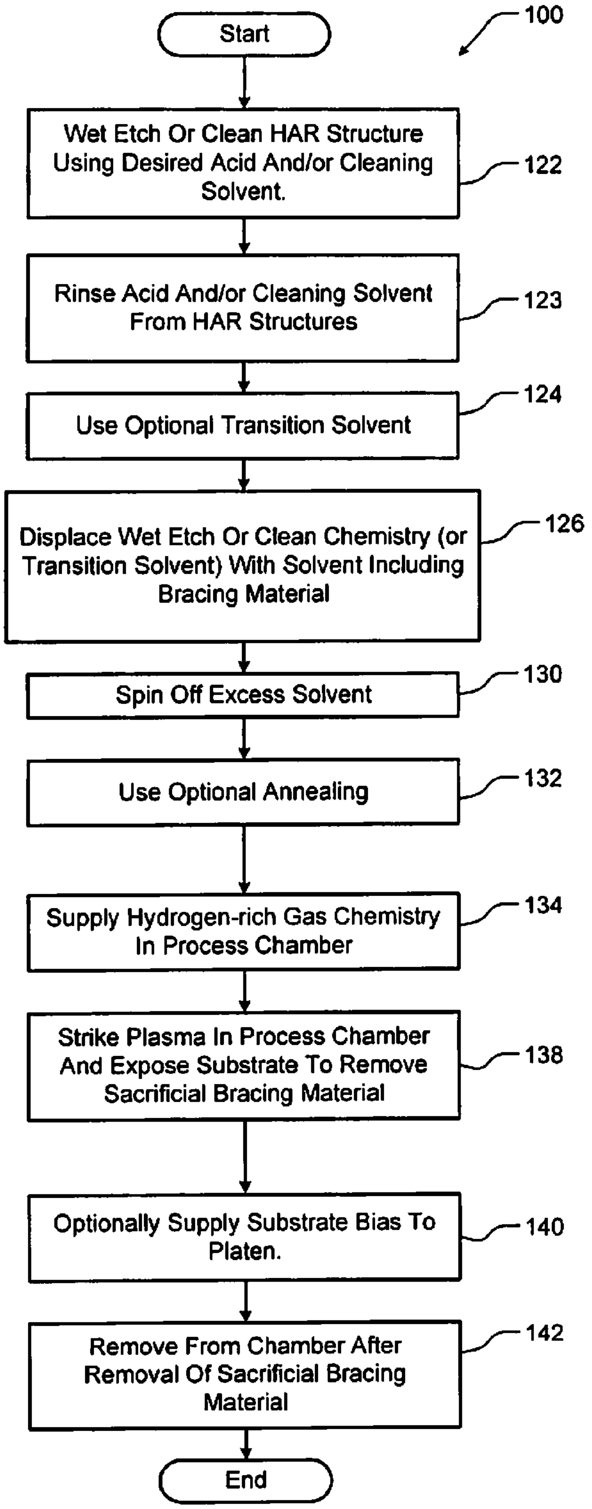
FIG. 1 is a flowchart illustrating an example of a method for drying a plurality of HAR features of a substrate using plasma.

Referring now to FIG. 1, a method 100 for drying a substrate including a plurality of HAR structures is shown. The substrate including the plurality of HAR structures is wet etched or cleaned at 122 using a desired etchant solution such as acid and/or a cleaning solution. After the wet etching or cleaning, the substrate is not dried and the wet etching or cleaning solution remains on the substrate.

In some examples, the HAR structures are lines/spaces, STI, FinFETs, or cylindrical capacitors. The materials may include metal, semiconductor or dielectric materials. In some examples, the etching and cleaning processes will be performed in a spin coating processing chamber.

At 123, a rinse solution may be used to displace the wet etching or cleaning solution. After the rinsing, the substrate is not dried and the rinsing solution remains on the substrate.

At 124, an optional transition solvent may be used to displace the rinsing solution. The transition solvent may be used depending on the chemical make-up and compatibility of the rinsing solutions and the solvent used to dissolve the bracing material.

At 126, the rinsing solutions or the optional transitional solvent is displaced by a solvent including a sacrificial bracing material. In some examples, the sacrificial bracing material includes one or more polymers and a nanoparticle additive. A surfactant may also be included. As can be appreciated, the substrate remains wet during steps 122, 123, 124, and 126. In some examples, the sacrificial bracing material includes a carbon-containing material that can be volatilized with plasma chemistry.

At 130, excess solvent may optionally be spun off. The sacrificial mechanical brace fills the plurality of HAR structures on the substrate. More specifically, as the solvent evaporates, the sacrificial bracing material precipitates out of solution and fills the structures. A mechanical brace is formed in the HAR structures to counter the capillary forces that are generated during solvent drying. The substrate may optionally be annealed or baked at 132, for example, to crosslink, remove residual solvent, and/or relax stresses. The substrate may be transferred to a plasma processing chamber or processing may continue without transfer if a combined spin coating and plasma processing chamber is used.

In some examples, the substrate support or platen heats the substrate to a temperature between 25° C.-400° C. during exposure to the plasma. At 134, the substrate is exposed to plasma gas chemistry. For example, the substrate may be exposed to a hydrogen rich plasma gas chemistry. Other gases may be mixed with the hydrogen rich gas to improve residue or etch rate and without modifying the surface of the HAR structures. In some examples, the additional gases may include mild oxidants or inert gases. Examples of mild oxidants include carbon dioxide, carbon monoxide, nitrous oxide, nitric oxide, nitrogen dioxide, sulfur oxide, sulfur dioxide, water, and oxygen containing hydrocarbons. In some examples, the mixture includes less than 10% $CO_2$. Inert gases may also be added, including nitrogen, argon, xenon, krypton, helium, and neon. In some examples, the $H_2$-rich molecules, such as methane ($CH_4$) or ammonia ($NH_3$), may be used. These H-rich or $H_2$-rich molecules may be used alone or in combination with inert gases and/or mild oxidants. While the example of a hydrogen rich plasma gas chemistry will be provided, another suitable plasma gas chemistry may be used, such as an oxygen rich plasma gas chemistry and/or ozone.

At 138, plasma is struck in the processing chamber and the substrate is exposed to the plasma to remove the sacrificial bracing material. In some examples, the plasma is remote or downstream plasma. In some examples, process conditions include plasma generated using an RF power of 500 W-10 kW, vacuum pressure of 0.1 Torr-3 Torr, and 500-10000 sccms total gas flow, although other process conditions may be used. At 140, an optional substrate RF bias may be used.

At 142, the substrate is removed from the plasma processing chamber after removal of sacrificial bracing material.

Figure 2A:
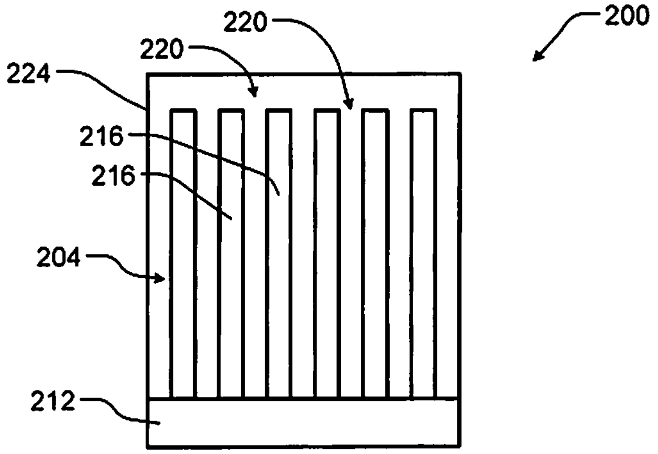
FIGS. 2A-2D are side views illustrating an example of a substrate during drying using plasma.

Referring now to FIGS. 2A-2D, an example of a substrate 200 is illustrated during drying using sacrificial bracing. In FIG. 2A, the substrate 200 includes a plurality of HAR structures 204 extending upwardly from a lower substrate layer 212. For example, the plurality of HAR structures 204 may include one or more pillars 216 or other structures such as lines/spaces, capacitors, etc. that extend upwardly from the lower substrate layer 212, although other HAR structures are contemplated.

Figure 2B:
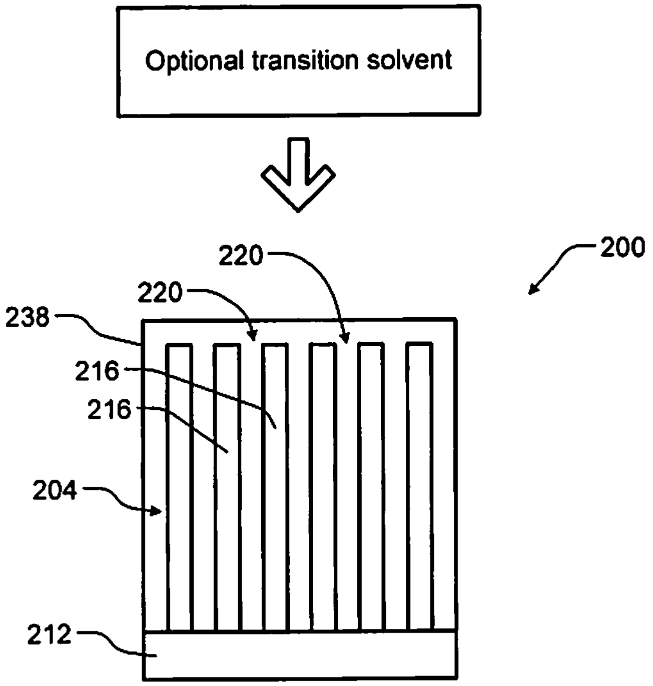
Figure 2C:
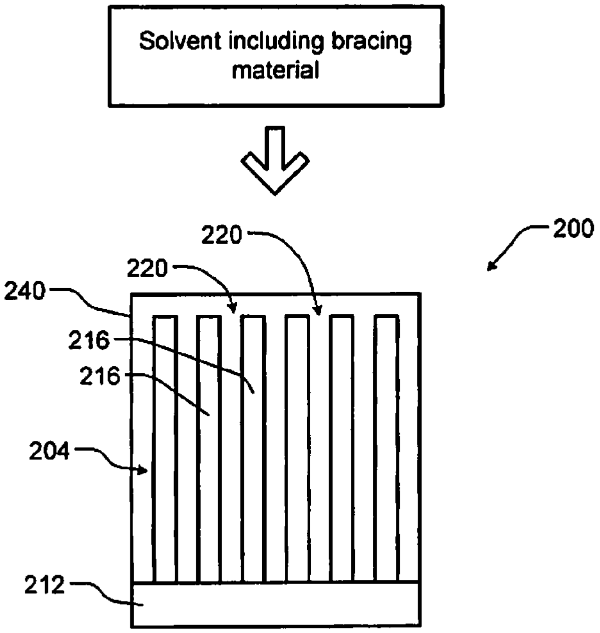
Figure 2D:
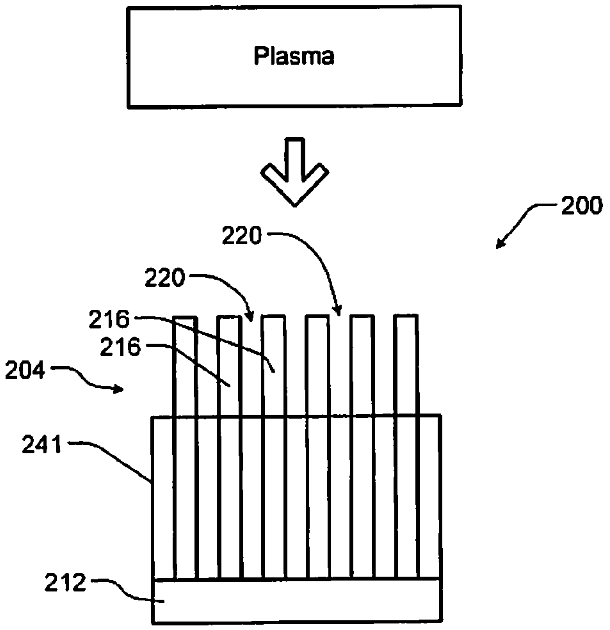

Fluid 224 remains on the substrate 200 after wet etching or wet cleaning. For example only, the fluid 224 may fill spaces 220 between the pillars 216. In FIG. 2B, an optional transition solvent 238 may be used to displace the fluid 224. In FIG. 2C, a solvent 240 including sacrificial bracing material may be used to displace the fluid 224 or the optional transition solvent 238 (if used). In FIG. 2D, the plasma may be used to remove sacrificial bracing material, shown partially removed at 241, without damaging the plurality of HAR structures 204.

Figure 3B:
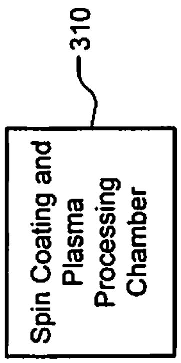
FIG. 3B is a functional block diagram illustrating a combined spin coating and plasma processing chamber.
Figure 3A:
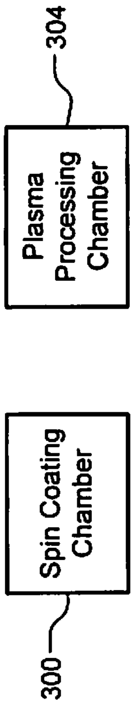
FIG. 3A is a functional block diagram illustrating a spin coating processing chamber and a plasma processing chamber.

Referring now to FIGS. 3A and 3B, examples of processing chambers for drying the substrate with the plurality of HAR structures is shown. In FIG. 3A, wet etching, cleaning, and/or rinsing may be performed in a spin coating processing chamber 300. In addition, the solvent with the sacrificial bracing material (or the transitional solvent and the solvent with the sacrificial bracing material) may be applied to the substrate in the spin coating processing chamber 300. Then, the substrate may be transferred to a plasma processing chamber 304 for plasma processing to remove the sacrificial bracing material without damage to the plurality of HAR structures.

In FIG. 3B, a combined spin coating and plasma processing chamber 310 is shown. Wet etching, cleaning, and/or rinsing may be performed using spin coating components of the combined spin coating and plasma processing chamber 310. The solvent with the sacrificial bracing material (or the transitional solvent and the solvent with the sacrificial bracing material) may be applied using the spin coating components. Then, plasma components of the combined spin coating and plasma processing chamber 310 for plasma processing to remove the sacrificial bracing material of the substrate without damaging the HAR structures.

Figure 4:
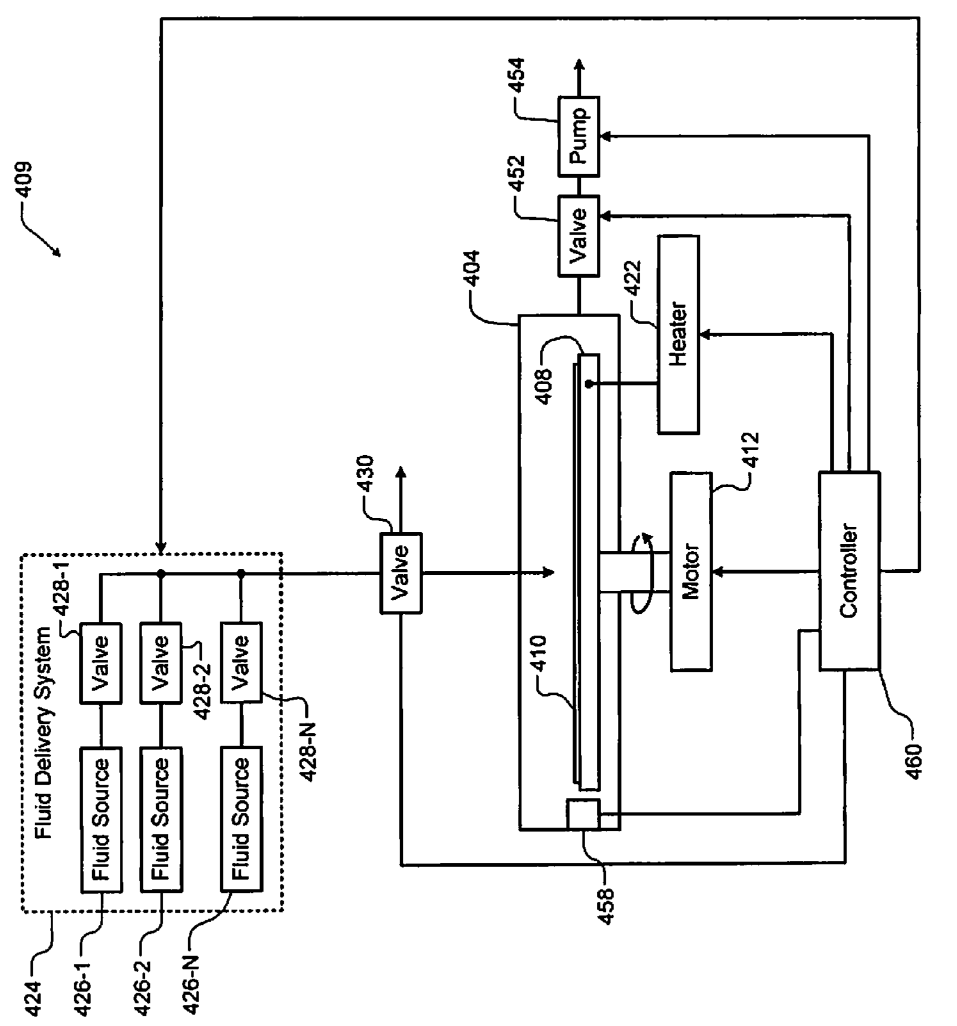
FIG. 4 is a functional block diagram of an example spin coating processing chamber.

Referring now to FIG. 4, an example of a system 409 including a spin coating processing chamber 404 is shown. A substrate support 408 such as a pedestal or platen may be provided. A substrate 410 is arranged on the substrate support 408. A motor 412 may be used to selectively rotate the substrate support 408 as needed to spin coat liquids on the substrate 410. The substrate support 408 may include an embedded coil (not shown) that is connected to a heater 422.

A fluid delivery system 424 is used to deliver fluids from one or more fluid sources 426-1, 426-2, . . . , and 426-N (collectively fluid sources 426) to the substrate 410. The fluid delivery system 424 may include one or more valves 428-1, 428-2, . . . , and 428-N (collectively valves 428). A diverting valve 430 may be used to flush fluids from the fluid delivery system 424. The fluid delivery system 424 may be configured to deliver fluids for wet etching, wet cleaning, flushing fluid, solvent including the structural bracing material, and/or other fluids. A valve 452 and a pump 454 may be used to evacuate reactants from the spin coating processing chamber 404 as needed. One or more sensors 458 may be provided to monitor conditions such as temperature and pressure in the process chamber 404.

A controller 460 may be used to control one or more devices in the system 409. More particularly, the controller 460 may be used to control the motor 412, the heater 422, the fluid delivery system 424, and/or the valve 452 and the pump 454. The controller 460 may operate in part based on feedback from the one or more sensors 458.

Figure 5:
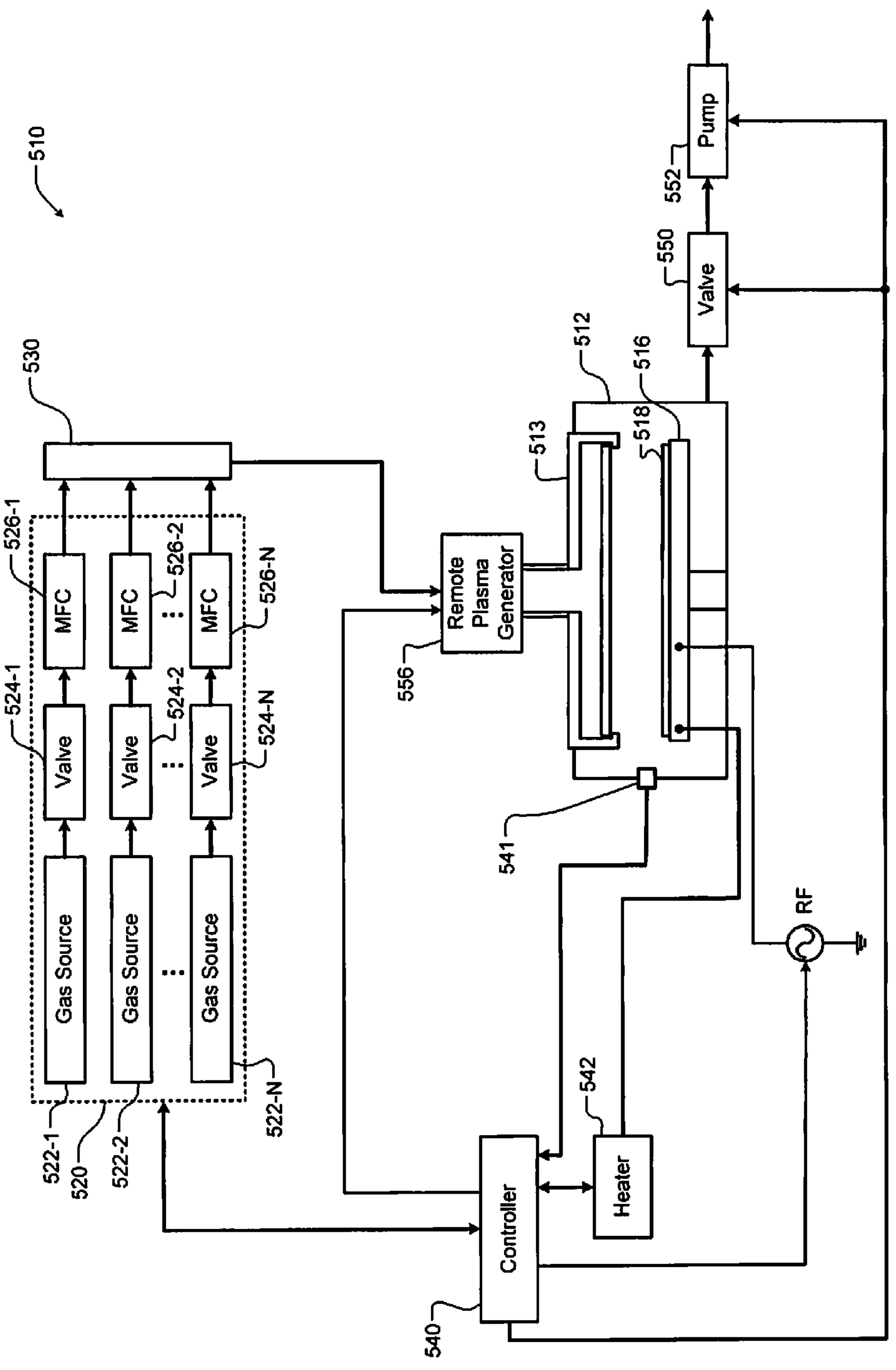
FIG. 5 is a functional block diagram of an example plasma processing chamber.

Referring now to FIG. 5, an example of a substrate processing system 510 according to the present disclosure is shown. The substrate processing system 510 includes a processing chamber 512 and a gas distribution device 513. In some examples, remote plasma may be supplied to or created in the gas distribution device 513 as will be described further below. A substrate support 516 such as a pedestal or platen may be arranged in the processing chamber 512. During use, a substrate 518 such as a semiconductor wafer or other type of substrate may be arranged on the substrate support 516.

The substrate processing system 510 includes a gas delivery system 520. For example only, the gas delivery system 520 may include one or more gas sources 522-1, 522-2, . . . , and 522-N (collectively gas sources 522) where N is an integer greater than zero, valves 524-1, 524-2, . . . , and 524-N (collectively valves 524), and mass flow controllers (MFC) 526-1, 526-2, . . . , and 526-N (collectively MFC 526). Outputs of the gas delivery system 520 may be mixed in a manifold 530 and delivered to the remote plasma source and/or to the gas distribution device 513. The gas delivery system 520 supplies the plasma gas chemistry.

A controller 540 may be connected to one or more sensors 541 that monitor operating parameters in the processing chamber 512 such as temperature, pressure, etc. A heater 542 may be provided to heat the substrate support 516 and the substrate 518 as needed. A valve 550 and pump 552 may be provided to evacuate gas from the processing chamber 512.

For example only, a plasma generator 556 may be provided. In some examples, the plasma generator 556 is a downstream plasma source. The plasma generator 556 may include a plasma tube, an inductive coil or another device to create the remote plasma. For example only, the plasma generator 556 may use radio frequency (RF) or microwave power to create remote plasma using the gas chemistry identified above. In some examples, an inductive coil is wound around an upper stem portion of a showerhead and is excited by an RF signal generated by an RF source and a matching network. Reactive gas flowing through the stem portion is excited into a plasma state by the RF signal passing though the inductive coil.

The controller 540 may be used to control the gas delivery system 520, the heater 542, the valve 550, the pump 552, and plasma generated by the plasma generator 556.

Figure 6:
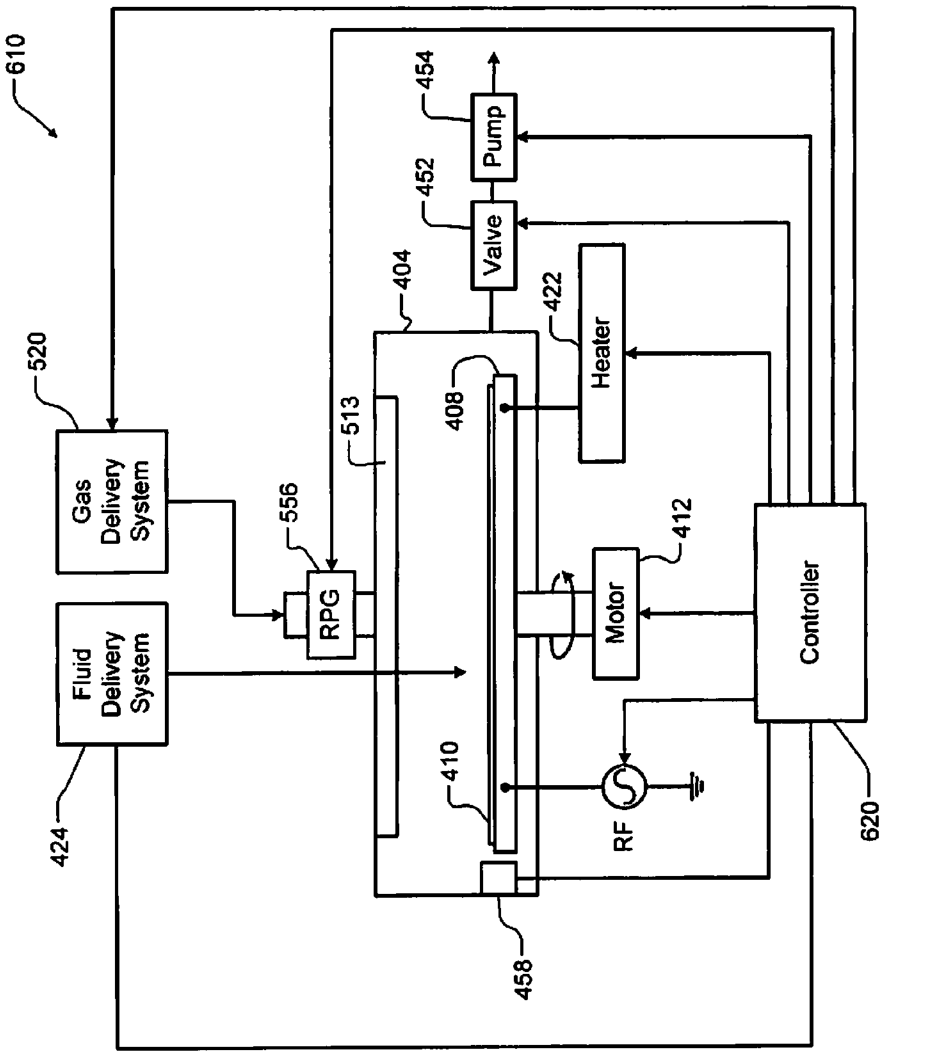
FIG. 6 is a functional block diagram of an example combined spin coating and plasma processing chamber.

Referring now to FIG. 6, a combined spin coating and plasma processing chamber 610 is shown. The combined spin coating and plasma processing chamber 610 includes a controller 620 configured to control wet etching or wet cleaning, wet rinsing, application of the optional transitional solvent, application of the solvent including the sacrificial bracing material, and generation of the plasma.

More particularly, the controller 620 delivers the wet etching solution or the cleaning solution or the wet rinsing solution to the substrate. Afterwards, the controller 620 delivers the solvent including the sacrificial bracing material (or the optional transitional solvent and then the solvent including the sacrificial bracing material). During or after fluid delivery, the controller may rotate the substrate support 408 using the motor 412 to spin-coat the fluid onto the substrate. Rotation of the substrate support 408 may also spin off excess solvent/sacrificial bracing material.

After application, the solvent evaporates, leaving the sacrificial bracing material which supports the HAR structures. Subsequently, the controller 620 controls the gas delivery system 520 and the plasma generator 556 to generate the plasma to remove the sacrificial bracing material and to dry the HAR structures without damaging the HAR structures. While the example of removal of the sacrificial bracing material including plasma is shown and described, the sacrificial bracing material may alternatively be removed using ozone.

In some examples, the sacrificial bracing material includes a polymer component and a nanoparticle component. The sacrificial bracing material is delivered via a solvent, as described above. For example only, suitable solvents include organic solvents and deionized water, although other solvents may be used. Sacrificial bracing material including nanoparticles may be thermally stable and enable higher ashing temperatures, therefore enabling higher throughput.

Examples of the nanoparticle component include, but are not limited to, organic polymers including nanoparticles or carbon-based nanoparticles (e.g., fullerenes or fullerols), organic particles, latexes, and inorganic nanoparticles (e.g., $SiO_2$). In some examples, a largest dimension of the nanoparticle material used is less than 12 nm, less than 10 nm, or less than 8 nm. In some examples, a largest dimension of the nanoparticle material is less than or equal to one-half of the (e.g., smallest) distance between adjacent HAR structures. In some examples, nanoparticle material is capable of being volatilized using the plasma chemistry.

Examples of the polymer include low molecular weight polymers or oligomers. Low molecular weight polymers may refer to polymers having a molecular weight of less than 15,000 grams per mol, less than 10,000 grams per mol, less than 8,000 grams per mol, less than 5,000 grams per mol, less than 3,000 grams per mol, less than 2,000 grams per mol, or less than 1,000 grams per mol. In some examples, polymers having a molecular weight of approximately 600 grams per mol may be used. In some examples, a largest dimension of the polymer is less than or equal to one-half of the (e.g., smallest) distance between adjacent HAR structures. In some examples, the polymer is capable of being volatilized using the plasma chemistry.

In some examples, the sacrificial bracing material may be polymer-rich relative to the nanoparticle material. In some examples, polymer-rich may refer to a weight ratio of polymer to nanoparticle material being greater than or equal to 1:1, greater than or equal to 2:1, greater than or equal to 3:1, greater than or equal to 5:1, greater than or equal to 10:1, greater than or equal to 25:1, or greater than or equal to 50:1. In some examples, a weight ratio of solid to solvent may be less than or equal to 0.40, less than or equal to 0.25, less than or equal to 0.2, less than or equal to 0.15, or less than or equal to 0.1, or less than or equal to 0.05. The solid may include polymeric solid and nanoparticle solid. As stated above, examples of solvents may include organic solvents and water.

The sacrificial bracing material may also include one or more surfactants to lower surface tension and/or improve filling of the spaces between the HAR structures and coating uniformity of the HAR structures. The surfactant used may be chosen based on miscibility, removal ability using plasma, and surface tension impact.

High temperatures and exothermic reactions that occur during plasma removal of the sacrificial bracing material may induce a glass transition in the sacrificial bracing material. This glass transition may cause the formation of a melt. The melt may behave like a liquid and can induce HAR structure collapse during removal of the sacrificial bracing material. Collapse could be prevented by designing a complex, cross-linking bracing material and/or limiting temperature during bracing material removal. This, however, may decrease processing throughput as removal of the bracing material may take longer to complete.

Adding the nanoparticle material increases the glass transition temperature of the sacrificial bracing material. Sacrificial bracing materials having a higher glass transition temperature and increased thermal stability are desirable to enhance processing throughput. The glass transition temperature of sacrificial bracing material including both polymer and nanoparticle material is greater than the glass transition temperature of a sacrificial bracing material not including the nanoparticle material. The nanoparticle material increases the glass transition temperature of the sacrificial braces due to interactions of the polymer with the particle surfaces, which slow polymer chain dynamics. Increasing the glass transition temperature allows higher temperatures to be used for plasma removal of the sacrificial bracing material, thereby increasing the plasma removal rate and decreasing processing time.

The nanoparticle material may also absorb onto walls of the HAR structures and prevent stiction. Some materials that precipitate from the solvent (e.g., silicates) may form a chemical bond, such as a silica bridge. The nanoparticle material may prevent this chemical bonding/bridge formation due to the nanoparticle material having larger dimensions. The nanoparticles may therefore decrease or prevent stiction.

For example only, a solution providing sacrificial bracing material has a higher glass transition temperature than the polymer and includes 10 wt % polyacrylamide (polymer), 1 wt % fullerols (nanoparticle material), 0.2 wt % ammonium dodecyl sulfate (surfactant), and deionized water (solvent). In another example, a solution providing sacrificial bracing material had a higher glass transition temperature than the polymer and includes 10 wt % polyacrylamide (polymer), 0.2 wt % fullerols (nanoparticle material), 0.2 wt % ammonium dodecyl sulfate (surfactant), and deionized water (solvent). As stated above, the weight ratios of the components of the composite can be selected/adjusted to optimize filling, coating uniformity, film thickness, and desired thermal properties of the resulting sacrificial braces. In some polymer-rich examples, the solution may include up to 20 wt % polymer, up to 10 wt % nanoparticle, up to 5 wt % surfactant, and the remainder solvent.

Figure 7B:
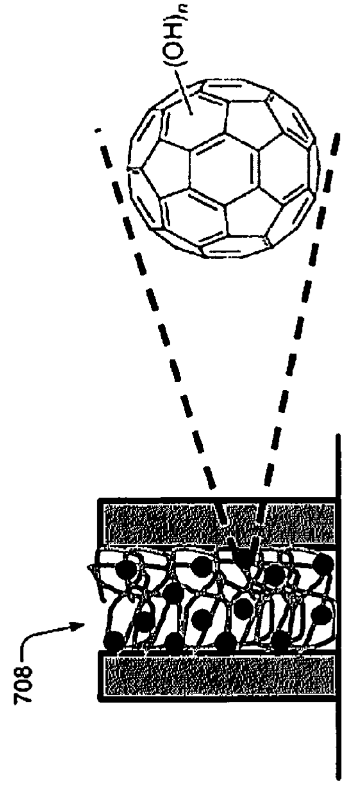
FIG. 7B is an example side view of a substrate and a sacrificial bracing material that includes a nanoparticle material.
Figure 7A:
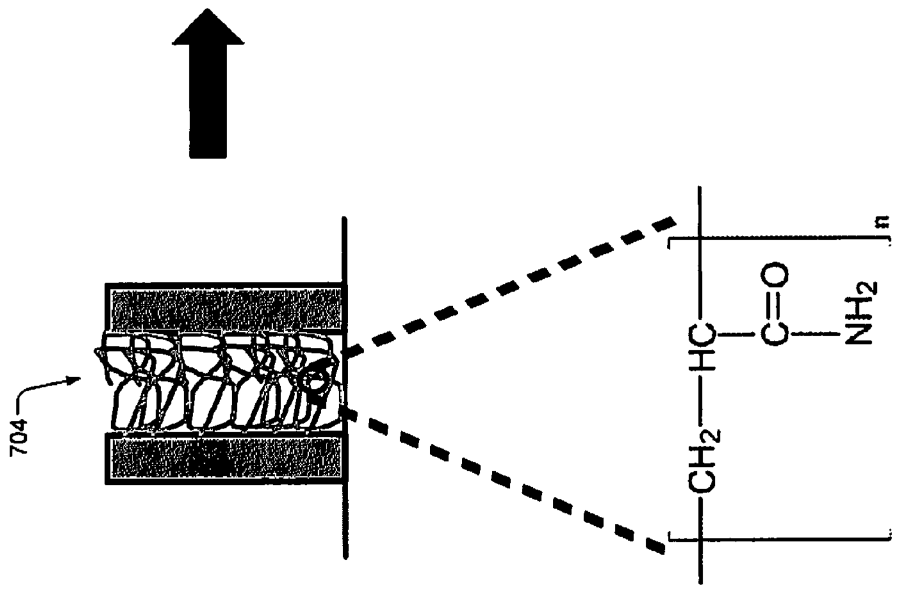
FIG. 7A is an example side view of a substrate and a sacrificial bracing material that does not include a nanoparticle material.

Referring how to FIG. 7A, an example portion of a substrate includes a sacrificial bracing material 704 that does not include a nanoparticle material. The sacrificial bracing material 704 may undergo a glass transition during plasma removal and form a melt. The melt may induce HAR structure collapse as the sacrificial bracing material 704 is removed. Additionally, bridging or chemical bonding may occur between adjacent HAR structures.

Referring now to FIG. 7B, an example portion of a substrate including a sacrificial bracing material 708 includes a nanoparticle material. For example only, C60-Fullerol (nanoparticle material) and a polyacrylamide (PAM) polymer may be used. The nanoparticle material increases the glass transition temperature of the resulting sacrificial bracing material. Higher temperatures may therefore be used during plasma removal of the sacrificial bracing material 708. Additionally, the nanoparticle material may prevent stiction by minimizing or preventing chemical bonding/bridging between adjacent HAR surfaces.

Figure 8:
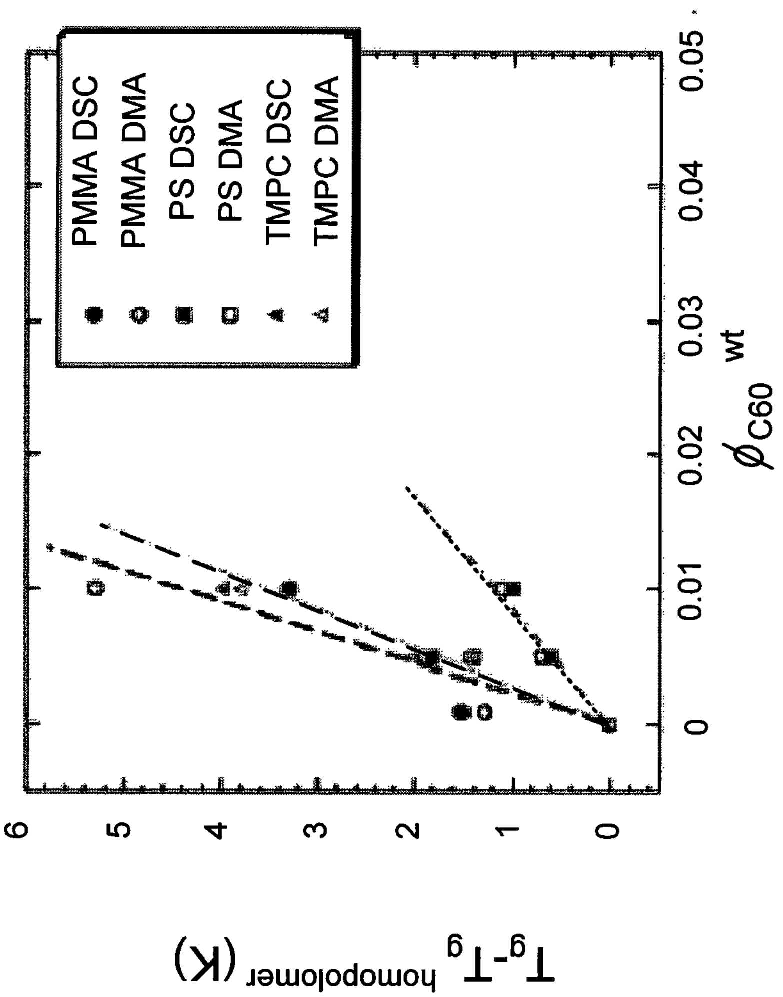
FIG. 8 is an example graph of glass transition temperature versus nanoparticle weight fraction for different polymers.

Referring now to FIG. 8, increasing the glass transition temperature of the sacrificial braces may also allow polymers having a lower glass transition temperature (Tg) to be used. Additional options for less expensive composite formulations may therefore be available and still produce collapse-free drying. For example only, glass transition temperatures for different types of polymers are shown as a function of fullerene nanoparticle weight fraction. FIG. 8 illustrates the use of different polymers based on the amount and type of nanoparticle material.

Some types of nanoparticle materials may only partially fill the spaces between the HAR structures and leave voids (non-filled areas) between adjacent HAR structures. Partial filling of the spaces between the HAR structures may stress the HAR structures. In some cases, annealing may help cause the sacrificial bracing material to fill the voids and reduce the stress on the HAR structures. In other cases, the sacrificial bracing material may not undergo a glass or phase transition at temperatures that are less than a maximum allowable device treatment temperature. As such, annealing may not help the sacrificial bracing material fill the voids before removal.

In some examples, the sacrificial bracing material may be nanoparticle-rich relative to the polymer. In some examples, nanoparticle-rich refers to a weight ratio of nanoparticle material to polymer being greater than or equal to 1:1, greater than or equal to 1.05:1, greater than 1.1:1, greater than or equal to 1.2:1, greater than or equal to or equal to, greater than 1.5:1, greater than or equal to 2:1. In some examples, a weight ratio of solid to solvent may be less than or equal to 0.40, less than or equal to 0.25, less than or equal to 0.2, less than or equal to 0.15, less than or equal to 0.1, or less than or equal to 0.05. The solid may include polymeric solid and nanoparticle material solid. As stated above, examples of solvents may include organic solvents and water.

The sacrificial bracing material may also include one or more surfactants to lower surface tension and/or improve filling of the spaces between the HAR structures and coating uniformity of the HAR structures. As stated above, the surfactant used may be chosen based on miscbility, removal ability using plasma, and surface tension impact.

The polymer may be a liquid or a solid and improves fluidity of the sacrificial bracing material. The polymer may include an organic-based polymer, an organic based oligomer, one or more organic molecules, and/or one or more ionic liquids. In some examples, the polymer is capable of being volatilized using the plasma chemistry. In some examples, the polymer is miscible in the solvent with the nanoparticle material.

An example of a solution providing sacrificial bracing material having increased fluidity for better filling includes 7 wt % fullerol (nanoparticles), 5 wt % polyacrylamide (polymer) with molecular weight<15000 g/mol, 0.2 wt % ammonium dodecyl sulfate (surfactant), and the remainder deionized water (solvent). Another example solution providing sacrificial bracing material having increased fluidity for better filling includes 7 wt % fullerol (nanoparticle material), 3 wt % polyethylene glycol (polymer) with molecular weight<1000 g/mol, 0.2 wt % ammonium dodecyl sulfate (surfactant), and deionized water (solvent). In some nanoparticle-rich examples, the solution may include up to 10 wt % polymer, up to 20 wt % nanoparticle, up to 5 wt % surfactant, and the remainder solvent. While specific examples are provided, the weight ratios or materials can be adjusted to optimize filling, coating uniformity, film thickness, and desired thermal properties of the composite sacrificial bracing material.

Figures 9A, 9B:
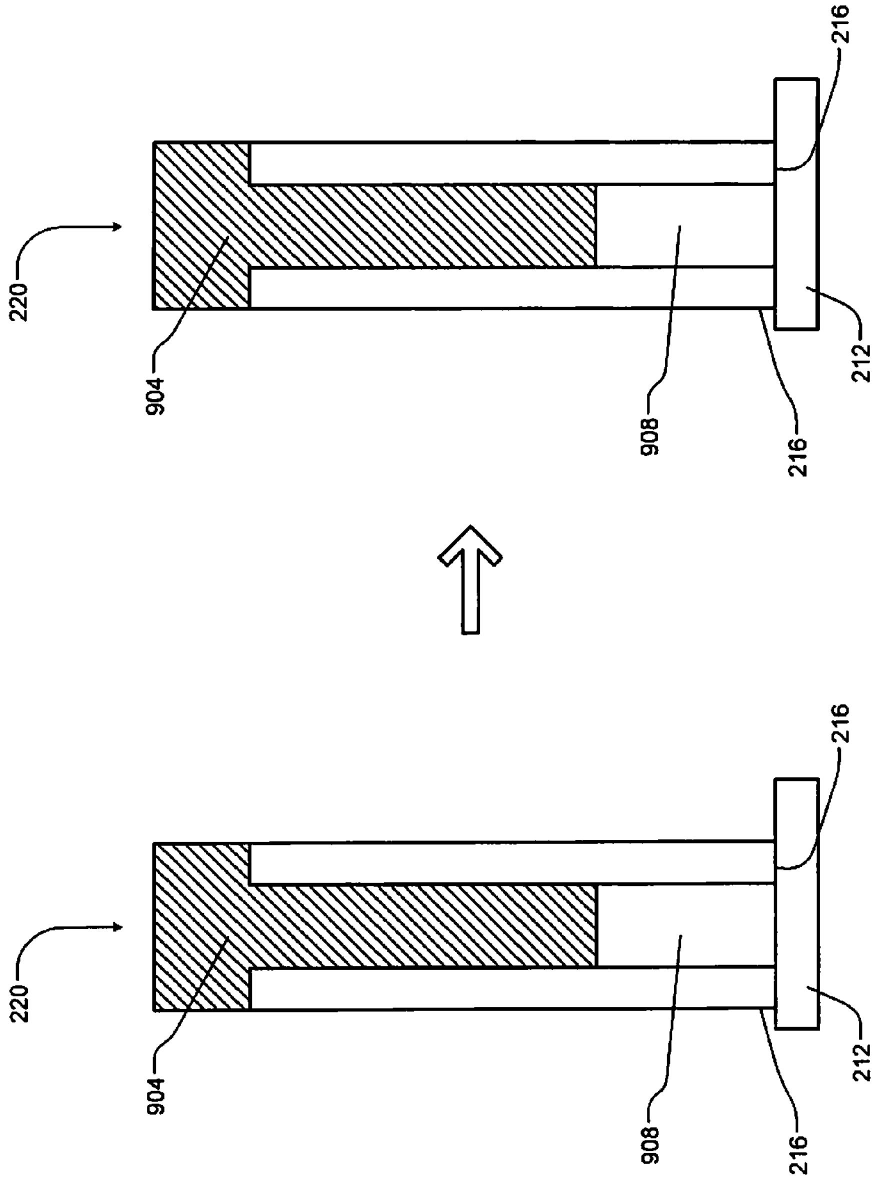
FIG. 9A is a pre-annealing side view of a portion of a substrate and a nanoparticle sacrificial bracing material that does not include a polymer additive material.
FIG. 9B is a post-annealing side view of a portion of a substrate and a nanoparticle sacrificial bracing material that does not include a polymer additive material.

Referring now to FIGS. 9A and 9B, an example of the sacrificial bracing material is shown. In FIG. 9A, of a portion of a substrate including two of the pillars 216, a space 220 between the two pillars 216, and a sacrificial bracing material 904 are shown before annealing. In FIG. 9B, the portion of the substrate including the two of the pillars 216, the space 220 between the pillars 216, and the sacrificial bracing material 904 are shown after annealing.

In the examples of FIGS. 9A and 9B, the sacrificial bracing material 904 does not include a polymer and only partially fills the space 220 which leaves a void 908 near the substrate 212. For example only, the sacrificial bracing material 904 may result from an example solution including 7 wt % Fullerol (nanoparticle material), 0.2 wt % Ammonium dodecyl sulfate (surfactant), and deionized water (solvent). Despite performing annealing at temperatures up to a maximum allowable device treatment temperature, the sacrificial bracing material 904 does not undergo a glass transition during the annealing. Thus, the void 908 remains after the annealing.

Figures 10A, 10B:
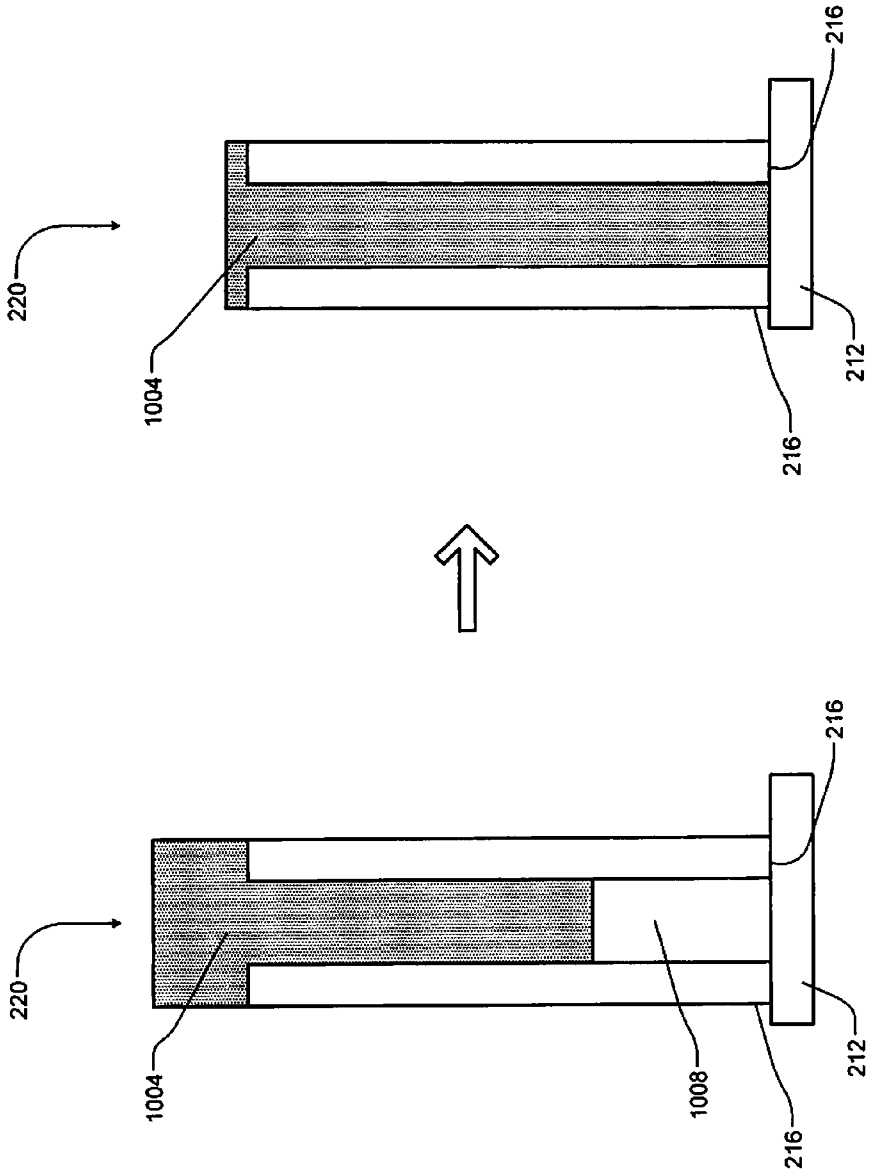
FIG. 10A is a pre-annealing side view of a portion of a substrate and a nanoparticle sacrificial bracing material that includes a polymer additive material.
FIG. 10B is a post-annealing side view of a portion of a substrate and a nanoparticle sacrificial bracing material that includes the polymer additive material.

Referring now to FIGS. 10A and 10B, another example of a sacrificial bracing material is shown. In FIG. 10A, a portion of a substrate including the pillars 216, the space 220 between the pillars 216, and a sacrificial bracing material 1004 are shown before annealing. In FIG. 10B, the portion of the substrate including the pillars 216, the space 220 between the pillars 216, and the sacrificial bracing material 1004 are shown after annealing. In the examples of FIGS. 10A and 10B, the sacrificial bracing material 1004 includes a polymer. The sacrificial bracing material 1004 may also include a surfactant. For example only, the sacrificial bracing material 1004 may result from an example solution including 7 wt % Fullerol (nanoparticle material), 0.2 wt % Ammonium dodecyl sulfate (surfactant), 3 wt % poly ethylene glycol (polymer), and deionized water (solvent).

In FIG. 10A, the sacrificial bracing material 1004 may only partially fill the space 220, which leaves a void 1008 near the substrate 212. In FIG. 10B, the sacrificial bracing material 1004 is shown after it flows into the space 220 and fills the void 1008. The sacrificial bracing material 1004 may flow into the space 220 and fill the void 1008 with or without annealing. The sacrificial bracing material 1004 flowing into and filling the void 1008 helps to prevent the collapse of the HAR structure after full or partial removal of the sacrificial bracing material 1004.

Figure 11B:
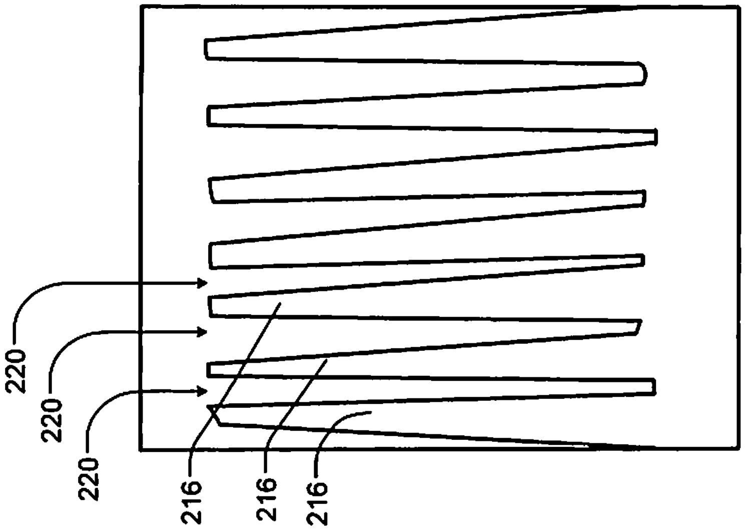
FIG. 11B is an example post-annealing side view of a substrate and the sacrificial bracing material that includes the nanoparticle material and the polymer.
Figure 11A:
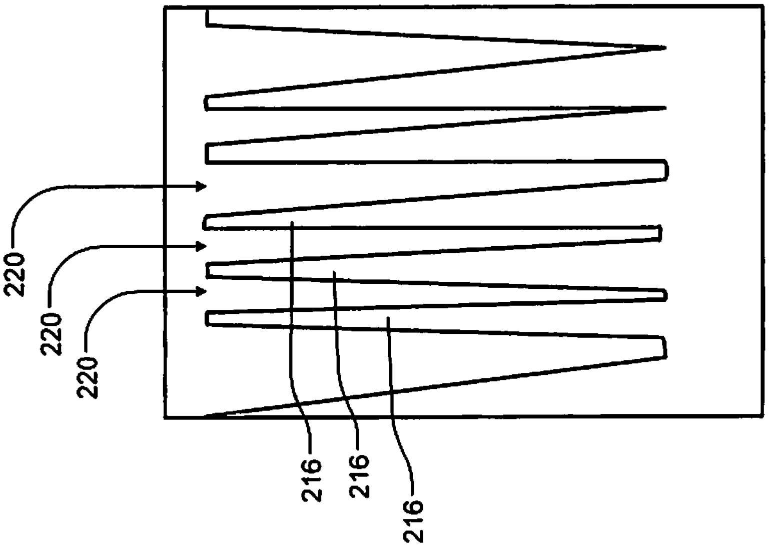
FIG. 11A is an example post-annealing side view of a substrate and a sacrificial bracing material that includes a nanoparticle material but that does not include a polymer.

Referring now to FIG. 11A, a substrate including a plurality of the pillars 216 and the spaces 220 between the pillars 216. In FIG. 11A, a sacrificial bracing material not including a polymer was used. For example only, the sacrificial bracing material of FIG. 11A may result from an example solution including 7 wt % Fullerol (nanoparticle material), 0.2 wt % Ammonium dodecyl sulfate (surfactant), and deionized water (solvent). As shown, the pillars 216 may be drawn toward each other due to voids between adjacent pillars, even after annealing.

Referring now to FIG. 11B, a substrate includes a plurality of the pillars 216 and the spaces 220 between the pillars 216. In FIG. 11B, a sacrificial bracing material including a polymer was used and annealing was performed. For example only, the sacrificial bracing material of FIG. 11B may result from an example solution including 7 wt % Fullerol (nanoparticle material), 0.2 wt % Ammonium dodecyl sulfate (surfactant), 3 wt % poly ethylene glycol (polymer) molecular weight 600 g/mol, and deionized water (solvent). As shown, the pillars 216 are drawn toward each other less than in the example of FIG. 11A.

In a feature, a method for drying a substrate including a plurality of high aspect ratio (HAR) structures is described. The method includes, after at least one of (i) wet etching, and (ii) wet cleaning, and (iii) wet rinsing the substrate using at least one of (a) wet etching solution, and (b) wet cleaning solution, and (c) wet rinsing solution, respectively, and without drying the substrate: depositing, between the plurality of HAR structures, a solution that includes a polymer component, a nanoparticle component, and a solvent; wherein as the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution; and exposing the substrate to plasma generated using a plasma gas chemistry to volatilize the sacrificial bracing material.

In other features, a weight ratio of the nanoparticle component of the solution to the polymer component of the solution is greater than or equal to 1:1. In other features, the solution includes a weight fraction of solid to solvent that is less than or equal to 0.4. In other features, the solution includes 5 percent by weight polyacrylamide having a molecular weight of less than 15,000 grams per mol, 7 percent by weight of a fullerol, 0.2 percent by weight of ammonium dodecyl sulfate, and the remainder being deionized water. In other features, the solution includes 7 percent by weight of a fullerol, 3 percent by weight of polyethylene glycol having a molecular weight of less than 1000 grams per mol, 0.2 percent by weight of ammonium dodecyl sulfate, and the remainder being deionized water. In other features, a weight ratio of the nanoparticle component of the solution to the polymer component of the solution is greater than or equal to 1.2:1. In other features, the solution further includes a surfactant. In other features, a largest dimension of the nanoparticle material is less than one-half of a distance between two adjacent ones of the plurality of HAR structures. In other features, a largest dimension of the nanoparticle material is less than 20 nanometers (nm). In other features, a largest dimension of the polymer material is less than one-half of the distance between the two adjacent ones of the plurality of HAR structures. In other features, a largest dimension of the polymer material is less than 20 nanometers (nm). In other features, a molecular weight of the polymer material is less than 15,000 grams per mol. In other features, a weight ratio of the polymer component of the solution to the nanoparticle component of the solution is greater than or equal to 5:1. In other features, a weight ratio of the polymer component of the solution to the nanoparticle component of the solution is greater than or equal to 10:1. In other features, a weight ratio of the polymer component of the solution to the nanoparticle component of the solution is greater than or equal to 1:1. In other features, the solution includes a weight fraction of solid to solvent that is less than or equal to 0.4. In other features, the solution includes 10 percent by weight polyacrylamide, 0.2 percent by weight of a fullerol, 0.2 percent by weight of ammonium dodecyl sulfate, and the remainder being deionized water. In other features, the solution includes 1 percent by weight of a fullerol, 10 percent by weight of polyacrylamide, 0.2 percent by weight of ammonium dodecyl sulfate, and the remainder being deionized water. In other features, a first glass transition temperature of the polymer material is less than a second glass transition temperature of the sacrificial bracing material. In other features, the plasma is downstream plasma.

In a feature, a system for drying a substrate including a plurality of high aspect ratio (HAR) structures is described. The system includes: a processing chamber; a substrate support arranged in the processing chamber; a gas delivery system to deliver a gas mixture to the processing chamber; a fluid delivery system configured to deliver a solution to the substrate; a plasma generator configured to generate plasma in the processing chamber; and a controller in communication with the fluid delivery system, the gas delivery system and the plasma generator. The controller is configured to, after one of (i) wet etching, or (ii) wet cleaning, or (iii) wet rinsing the substrate using at least one of (a) wet etching solution or (b) wet cleaning solution, or (c) wet rinsing solution, respectively, and without drying the substrate: deposit, between the plurality of HAR structures, a solution that includes a polymer component, a nanoparticle component, and a solvent; and expose the substrate to plasma generated using a plasma gas chemistry to volatilize the sacrificial bracing material. As the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution.

In other features, a weight ratio of the nanoparticle component of the solution to the polymer component of the solution is greater than or equal to 1:1. In other features, the solution includes a weight fraction of solid to solvent that is less than or equal to 0.4. In other features, the solution includes 5 percent by weight polyacrylamide having a molecular weight of less than 15,000 grams per mol, 7 percent by weight of a fullerol, 0.2 percent by weight of ammonium dodecyl sulfate, and the remainder being deionized water. In other features, the solution includes 7 percent by weight of a fullerol, 3 percent by weight of polyethylene glycol having a molecular weight of less than 1000 grams per mol, 0.2 percent by weight of ammonium dodecyl sulfate, and the remainder being deionized water. In other features, a weight ratio of the nanoparticle component of the solution to the polymer component of the solution is greater than or equal to 1.2:1. In other features, the solution further includes a surfactant. In other features, a largest dimension of the nanoparticle material is less than one-half of a distance between two adjacent ones of the plurality of HAR structures. In other features, a largest dimension of the nanoparticle material is less than 20 nanometers (nm). In other features, a largest dimension of the polymer material is less than one-half of the distance between the two adjacent ones of the plurality of HAR structures. In other features, a largest dimension of the polymer material is less than 20 nanometers (nm). In other features, a molecular weight of the polymer material is less than 15,000 grams per mol. In other features, a weight ratio of the polymer component of the solution to the nanoparticle component of the solution is greater than or equal to 5:1. In other features, a weight ratio of the polymer component of the solution to the nanoparticle component of the solution is greater than or equal to 10:1. In other features, a weight ratio of the polymer component of the solution to the nanoparticle component of the solution is greater than or equal to 1:1. In other features, the solution includes a weight fraction of solid to solvent that is less than or equal to 0.4. In other features, the solution includes 10 percent by weight polyacrylamide, 0.2 percent by weight of a fullerol, 0.2 percent by weight of ammonium dodecyl sulfate, and the remainder being deionized water. In other features, the solution includes 1 percent by weight of a fullerol, 10 percent by weight of polyacrylamide, 0.2 percent by weight of ammonium dodecyl sulfate, and the remainder being deionized water. In other features, a first glass transition temperature of the polymer material is less than a second glass transition temperature of the sacrificial bracing material. In other features, the plasma generator is configured to generate downstream plasma in the processing chamber.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a plasma strip chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for drying a substrate including a plurality of high aspect ratio (HAR) structures to prevent collapse of the plurality of HAR structures, the method comprising:

after at least one of (i) wet etching, and (ii) wet cleaning, and (iii) wet rinsing the substrate using at least one of (a) wet etching solution, and (b) wet cleaning solution, and (c) wet rinsing solution, respectively, and without drying the substrate:

depositing, between the plurality of HAR structures, a solution that includes a polymer component, a nanoparticle component, and a solvent;

wherein as the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution; and exposing the substrate to plasma generated using a plasma gas chemistry to volatilize the sacrificial bracing material.

2. The method of claim 1 wherein a weight ratio of the nanoparticle component of the solution to the polymer component of the solution is greater than or equal to 1:1.

3. The method of claim 2 wherein the solution includes a weight fraction of solid to solvent that is less than or equal to 0.4.

4. The method of claim 2 wherein the solution includes 5 percent by weight polyacrylamide having a molecular weight of less than 15,000 grams per mol, 7 percent by weight of a fullerol, 0.2 percent by weight of ammonium dodecyl sulfate, and the remainder being deionized water.

5. The method of claim 2 wherein the solution includes 7 percent by weight of a fullerol, 3 percent by weight of polyethylene glycol having a molecular weight of less than 1000 grams per mol, 0.2 percent by weight of ammonium dodecyl sulfate, and the remainder being deionized water.

6. The method of claim 1 wherein a weight ratio of the nanoparticle component of the solution to the polymer component of the solution is greater than or equal to 1.2:1.

7. The method of claim 1 wherein the solution further includes a surfactant.

8. The method of claim 1 wherein a largest dimension of the nanoparticle material is less than one-half of a distance between two adjacent ones of the plurality of HAR structures.

9. The method of claim 8 wherein a largest dimension of the nanoparticle material is less than 20 nanometers (nm).

10. The method of claim 8 wherein a largest dimension of the polymer material is less than one-half of the distance between the two adjacent ones of the plurality of HAR structures.

11. The method of claim 10 wherein a largest dimension of the polymer material is less than 20 nanometers (nm).

12. The method of claim 1 wherein a molecular weight of the polymer material is less than 15,000 grams per mol.

13. The method of claim 1 wherein a weight ratio of the polymer component of the solution to the nanoparticle component of the solution is greater than or equal to 5:1.

14. The method of claim 1 wherein a weight ratio of the polymer component of the solution to the nanoparticle component of the solution is greater than or equal to 10:1.

15. The method of claim 1 wherein a weight ratio of the polymer component of the solution to the nanoparticle component of the solution is greater than or equal to 1:1.

16. The method of claim 15 wherein the solution includes a weight fraction of solid to solvent that is less than or equal to 0.4.

17. The method of claim 15 wherein the solution includes 10 percent by weight polyacrylamide, 0.2 percent by weight of a fullerol, 0.2 percent by weight of ammonium dodecyl sulfate, and the remainder being deionized water.

18. The method of claim 15 wherein the solution includes 1 percent by weight of a fullerol, 10 percent by weight of polyacrylamide, 0.2 percent by weight of ammonium dodecyl sulfate, and the remainder being deionized water.

19. The method of claim 15 wherein a first glass transition temperature of the polymer material is less than a second glass transition temperature of the sacrificial bracing material.

20. The method of claim 1 wherein the plasma is downstream plasma.

21. A system for drying a substrate including a plurality of high aspect ratio (HAR) structures to prevent collapse of the plurality of HAR structures, the system comprising:

a processing chamber;

a substrate support arranged in the processing chamber;

a gas delivery system to deliver a gas mixture to the processing chamber;

a fluid delivery system configured to deliver a solution to the substrate;

a plasma generator configured to generate plasma in the processing chamber;

a controller in communication with the fluid delivery system, the gas delivery system and the plasma generator and configured to, after one of (i) wet etching, or (ii) wet cleaning, or (iii) wet rinsing the substrate using at least one of (a) wet etching solution or (b) wet cleaning solution, or (c) wet rinsing solution, respectively, and without drying the substrate:

deposit, between the plurality of HAR structures, a solution that includes a polymer component, a nanoparticle component, and a solvent;

wherein as the solvent evaporates, a sacrificial bracing material precipitates out of solution and at least partially fills the plurality of HAR structures, the sacrificial bracing material including (i) polymer material from the polymer component of the solution and (ii) nanoparticle material from the nanoparticle component of the solution; and expose the substrate to plasma generated using a plasma gas chemistry to volatilize the sacrificial bracing material.

22. The system of claim 21 wherein a weight ratio of the nanoparticle component of the solution to the polymer component of the solution is greater than or equal to 1:1.

23. The system of claim 22 wherein the solution includes a weight fraction of solid to solvent that is less than or equal to 0.4.

24. The system of claim 22 wherein the solution includes 5 percent by weight polyacrylamide having a molecular weight of less than 15,000 grams per mol, 7 percent by weight of a fullerol, 0.2 percent by weight of ammonium dodecyl sulfate, and the remainder being deionized water.

25. The system of claim 22 wherein the solution includes 7 percent by weight of a fullerol, 3 percent by weight of polyethylene glycol having a molecular weight of less than 1000 grams per mol, 0.2 percent by weight of ammonium dodecyl sulfate, and the remainder being deionized water.

26. The system of claim 21 wherein a weight ratio of the nanoparticle component of the solution to the polymer component of the solution is greater than or equal to 1.2:1.

27. The system of claim 21 wherein the solution further includes a surfactant.

28. The system of claim 21 wherein a largest dimension of the nanoparticle material is less than one-half of a distance between two adjacent ones of the plurality of HAR structures.

29. The system of claim 28 wherein a largest dimension of the nanoparticle material is less than 20 nanometers (nm).

30. The system of claim 28 wherein a largest dimension of the polymer material is less than one-half of the distance between the two adjacent ones of the plurality of HAR structures.

31. The system of claim 30 wherein a largest dimension of the polymer material is less than 20 nanometers (nm).

32. The system of claim 21 wherein a molecular weight of the polymer material is less than 15,000 grams per mol.

33. The system of claim 21 wherein a weight ratio of the polymer component of the solution to the nanoparticle component of the solution is greater than or equal to 5:1.

34. The system of claim 21 wherein a weight ratio of the polymer component of the solution to the nanoparticle component of the solution is greater than or equal to 10:1.

35. The system of claim 21 wherein a weight ratio of the polymer component of the solution to the nanoparticle component of the solution is greater than or equal to 1:1.

36. The system of claim 35 wherein the solution includes a weight fraction of solid to solvent that is less than or equal to 0.4.

37. The system of claim 35 wherein the solution includes 10 percent by weight polyacrylamide, 0.2 percent by weight of a fullerol, 0.2 percent by weight of ammonium dodecyl sulfate, and the remainder being deionized water.

38. The system of claim 35 wherein the solution includes 1 percent by weight of a fullerol, 10 percent by weight of polyacrylamide, 0.2 percent by weight of ammonium dodecyl sulfate, and the remainder being deionized water.

39. The system of claim 35 wherein a first glass transition temperature of the polymer material is less than a second glass transition temperature of the sacrificial bracing material.

40. The system of claim 21 wherein the plasma generator is configured to generate downstream plasma in the processing chamber.

* * * * *